United States Patent
Turullols (10) Patent No.: US 9,599,645 B2
(45) Date of Patent: Mar. 21, 2017

(54) HIGH SPEED CLOCK CYCLE RATE DIGITAL VOLTAGE MONITOR WITH TRIGGERED TRACING FOR INTEGRATED CIRCUITS

(71) Applicant: Oracle International Corporation, Redwood City, CA (US)

(72) Inventor: Sebastian Turullols, Los Altos, CA (US)

(73) Assignee: Oracle International Corporation, Redwood City, CA (US)

( * ) Notice: Subject to any disclaimer, the term of this patent is extended or adjusted under 35 U.S.C. 154(b) by 103 days.

(21) Appl. No.: 13/903,445

(22) Filed: May 28, 2013

(65) Prior Publication Data

US 2014/0354264 A1    Dec. 4, 2014

(51) Int. Cl.
| | |
|---|---|
| G01R 31/28 | (2006.01) |
| G01R 29/26 | (2006.01) |
| G01R 19/25 | (2006.01) |
| G01R 31/317 | (2006.01) |

(52) U.S. Cl.
CPC .... *G01R 19/2503* (2013.01); *G01R 31/31721* (2013.01)

(58) Field of Classification Search
CPC ........ G01R 31/28; G01R 29/26; G01R 31/40; G01R 19/25; G01R 19/16552; G01R 19/2513; G01R 21/133; G01R 19/165; G01R 19/16538; G01R 31/002; G01R 31/318575; G05F 1/10; G05F 1/62
USPC ...... 324/113, 613, 713; 702/58, 85; 713/322
See application file for complete search history.

(56) References Cited

U.S. PATENT DOCUMENTS

| | | | |
|---|---|---|---|
| 6,538,497 B2 | 3/2003 | Thomas et al. | |
| 6,653,891 B1 | 11/2003 | Hazucha | |
| 7,332,916 B2* | 2/2008 | Nagata | 324/713 |
| 7,902,800 B2 | 3/2011 | Jain et al. | |
| 8,283,933 B2* | 10/2012 | Dasnurkar | 324/613 |
| 8,898,029 B1* | 11/2014 | Wong et al. | 702/85 |
| 2006/0190878 A1* | 8/2006 | Rius Vazquez et al. | 716/6 |
| 2010/0146364 A1* | 6/2010 | Lee et al. | 714/752 |
| 2011/0193589 A1* | 8/2011 | Chua-Eoan et al. | 326/16 |
| 2011/0291630 A1* | 12/2011 | Konstadinidis et al. | 323/283 |
| 2011/0298474 A1* | 12/2011 | Cheruiyot | G01R 29/26 324/613 |
| 2012/0126847 A1* | 5/2012 | Kosonocky et al. | 324/764.01 |

OTHER PUBLICATIONS

Restriction Requirement regarding U.S. Appl. No. 12/787,135, dated Mar. 22, 2013.

(Continued)

*Primary Examiner* — Son Le
*Assistant Examiner* — Akm Zakaria
(74) *Attorney, Agent, or Firm* — Polsinelli PC (57) ABSTRACT

Implementations of the present disclosure involve a system and/or method for measuring on-die voltage levels of an integrated circuit through a digital sampling circuit. In particular, the system and/or method utilizes a delay line based analog-to-digital sampling circuit that produces a voltage reading over time, such as at every high frequency clock cycle. The digitized samples are routed to either an on-die memory structure for later analysis or are transmitted to one or more pins of a chip for capture and analysis by an external analyzer.

8 Claims, 7 Drawing Sheets

(56) References Cited

OTHER PUBLICATIONS

Response to Restriction Requirement regarding U.S. Appl. No. 12/787,135, dated May 22, 2013.
Non-Final Office Action regarding U.S. Appl. No. 12/787,135, dated Jun. 25, 2013.
Response to Non-Final Office Action regarding U.S. Appl. No. 12/787,135, dated Sep. 25, 2013.
Notice of Allowance regarding U.S. Appl. No. 12/787,135, dated Oct. 23, 2013.

* cited by examiner

HIGH SPEED CLOCK CYCLE RATE DIGITAL VOLTAGE MONITOR WITH TRIGGERED TRACING FOR INTEGRATED CIRCUITS

FIELD OF THE DISCLOSURE

Aspects of the present invention relate to computing systems and, more particularly, aspects of the present invention involve monitoring and regulating voltages within an integrated circuit.

BACKGROUND

Computers are ubiquitous in today's society. They come in all different varieties and can be found in places such as automobiles, laptops or home personal computers, banks, personal digital assistants, cell phones, as well as many businesses. In addition, as computers become more commonplace and software becomes more complex, there is a need for the computing devices to perform faster and more reliably in smaller and smaller packages.

As the design of computing systems continues to increase in complexity, certain tradeoffs are generally considered by a designer. For example, during design of an integrated circuit, such as a multi-core processor, analysis of the operation of the integrated circuit may be monitored and tested to improve the performance of the circuit. In particular, monitoring of a voltage in an integrated circuit allows for optimization of the power consumed by the circuit. Minimizing the voltage for a given operating frequency reduces the circuit operating power consumption. Lower power consumption for an integrated circuit design may be desirable over higher power consuming circuits. In addition, various levels of voltage noise may be present in an operating circuit or chip that can degrade the performance of the chip. Such so-called voltage droop may occur during heavy loading conditions. In this case, the amount of current demanded by the processor exceeds that which can be provided by the power supply and, as result, the power supply voltage at the transistor level droops. Thus, the ability to monitor and account for operational voltage noise, in addition to monitoring the power consumption of a design, aids in designing a better performing circuit.

Past circuit designs that allow for on-die voltage level measurement of the circuit typically employed one or more analog sensing pins that connect to a voltage meter. However, because these pins are typically located at the outer edge of the integrated circuit, the sensing pins do not accurately reflect the high frequency components of the circuit as the voltage signal is filtered before reaching the sensing pins. Thus, voltage measurement and performance analysis of an integrated circuit may become inaccurate at a high operating frequency. Further, as the operating frequency of integrated circuits increase, the performance monitoring of the circuits becomes less accurate. It is with these and other issues in mind that various aspects of the present disclosure were developed.

SUMMARY

One implementation of the present disclosure may take the form of a digital voltage monitor circuit of an integrated circuit. The digital voltage monitor circuit comprises a voltage monitor circuit configured to sample a power supply voltage of an integrated circuit during a clock cycle and configured to output a N-bit output value corresponding to a power supply voltage measurement and a trigger circuit electrically connected to an output of the voltage monitor circuit, the trigger circuit configured to compare a pre-determined N-bit trigger value to the N-bit output value and transmit an asserted trigger signal when a triggering event occurs. The digital voltage monitor circuit also includes an N-bit bus electrically connected to the output of the voltage monitor circuit and a static random access memory (SRAM) device electrically connected to the N-bit bus and the trigger circuit, the SRAM device configured to store at least the N-bit output value corresponding to the power supply voltage measurement when the trigger signal is asserted.

Another implementation of the present disclosure may take the form of a method for measuring a voltage level in an integrated circuit. The method comprises the operations of receiving a first N-bit output value corresponding to a first power supply voltage measurement and an N-bit trigger value corresponding to a pre-determined voltage measurement threshold value and comparing the N-bit trigger value to the first N-bit output value, the comparison configured to detect whether the first N-bit output value corresponding to the power supply voltage measurement is less than the voltage measurement threshold value. The method also includes the operations comparing the N-bit trigger value to the first N-bit output value, the comparison configured to detect whether the first N-bit output value corresponding to the power supply voltage measurement is less than the voltage measurement threshold value, transmitting an enable signal to a memory device when the first N-bit output value corresponding to the power supply voltage measurement is less than the voltage measurement threshold value and storing a plurality of N-bit output values corresponding to a plurality of power supply voltage measurements in the memory device for a period of time until the memory device is full.

DETAILED DESCRIPTION

Implementations of the present disclosure involve a system and/or method for measuring on-die voltage levels of an integrated circuit through a digital sampling circuit. In particular, the system and/or method utilizes a delay line based analog-to-digital sampling circuit that produces a voltage reading over time, such as at every high frequency clock cycle. The digitized samples are routed to either an on-die memory structure for later analysis or are transmitted to one or more pins of a chip for capture and analysis by an external analyzer.

In one embodiment, the measuring of the voltage level may start upon the occurrence of a programmable triggering event. For example, a programmable threshold value may be provided to the circuit that, upon occurrence of the threshold value in the circuit, the circuit may begin capturing the voltage levels of the circuit over time, such as on each clock cycle of the circuit. This information may be stored in a memory component of the circuit or fed to one or more output pins of the circuit for capture and analysis by an external analyzer. In the example where the voltage readings are stored in a memory component, the readings may be read from the memory component at a later time and analyzed to determine the performance of the circuit after the triggering event occurred.

Another advantaged realized through the circuit of the present disclosure is that the voltage levels for the integrated circuit may be read and analyzed in over a certain time frame. This allows for deeper analysis of the performance of the circuit over previously designed on-die voltage measuring circuits that would only provide snapshots or one-at-a-time measurements of the voltage of the circuit. By providing a circuit for measuring and reading of the on-die voltage over time, the performance of the circuit can be analyzed over various conditions and loads to provide a deeper understanding of the performance of the circuit. In addition, the measurements of the voltage levels of the circuit may be run on any clock signal of the circuit, as desired. Also, any number of voltage measuring circuits may be implemented within the circuit design such that voltage levels may be measured at different points in the circuit design. For example, voltage measurements may be taken at or near a cache component of a circuit, at or near a crossbar component, at or near a processing component, and the like.

Figure 1:
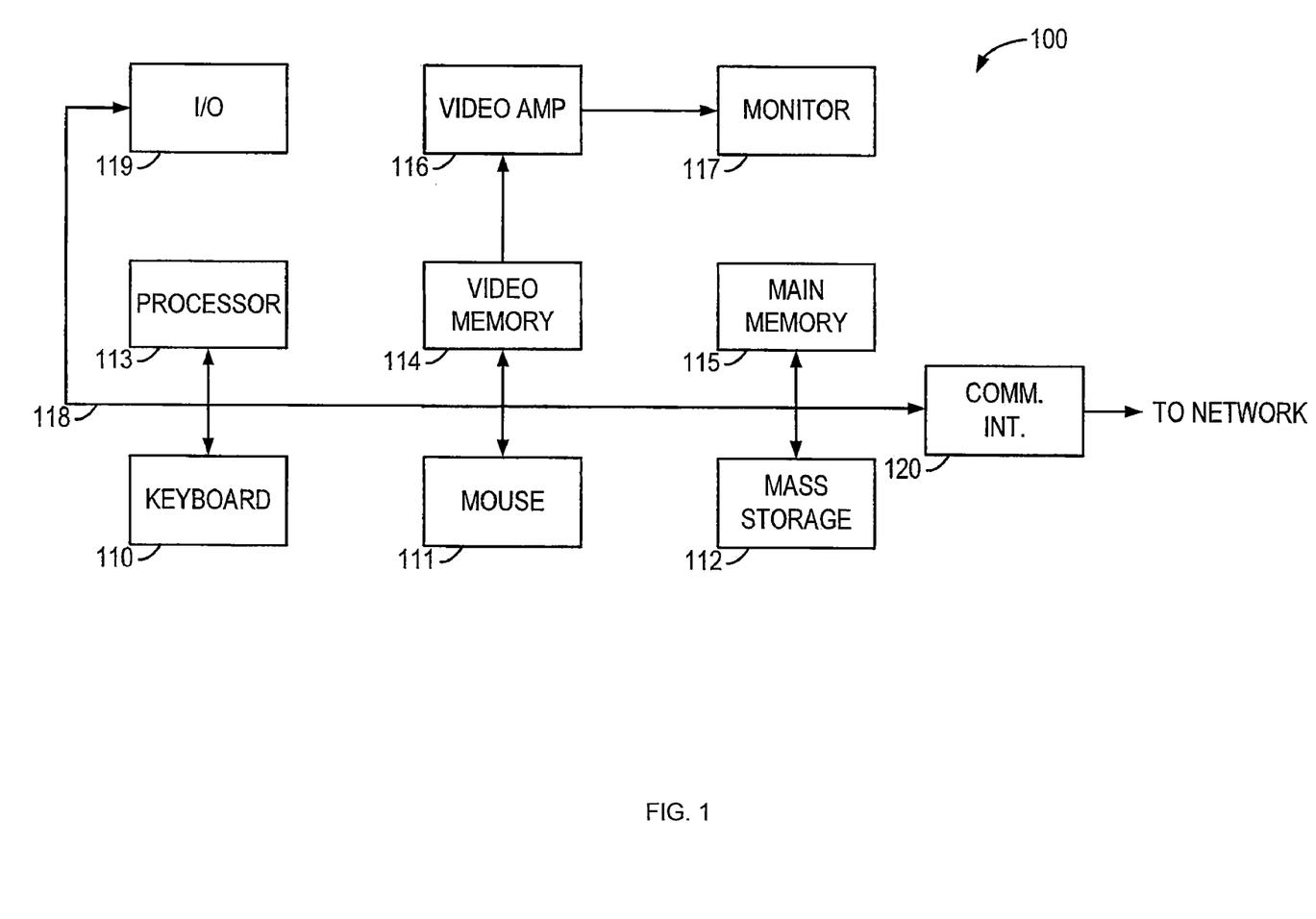
FIG. 1 is a block diagram illustrating an example of a computing system which may be used in implementing embodiments of the present disclosure.

FIG. 1 illustrates an exemplary computer system 100 capable of implementing the methods and operations described in this disclose. In some embodiments, the computer system 100 may be an implementation of enterprise level computers, such as one or more blade-type servers within an enterprise. In other embodiments, the computer system 100 may be a personal computer and/or a handheld electronic device. A keyboard 110 and mouse 111 may be coupled to the computer system 100 via a system bus 118. The keyboard 110 and the mouse 111, in one example, may introduce user input to the computer system 100 and communicate that user input to a processor 113. Other suitable input devices may be used in addition to, or in place of, the mouse 111 and the keyboard 110. An input/output unit 119 (I/O) coupled to system bus 118 represents such I/O elements as a printer, audio/video (A/V) I/O, etc.

Computer 100 also may include a video memory 114, a main memory 115 and a mass storage 112, all coupled to the system bus 118 along with the keyboard 110, the mouse 111 and the processor 113. The mass storage 112 may include both fixed and removable media, such as magnetic, optical or magnetic optical storage systems and any other available mass storage technology. The bus 118 may contain, for example, address lines for addressing the video memory 114 or the main memory 115. In some embodiments, the main memory 115 is a fully buffered dual inline memory module (FB-DIMM) that communicates serially with other system components.

The system bus 118 also may include a data bus for transferring data between and among the components, such as the processor 113, the main memory 115, the video memory 114 and the mass storage 112. The video memory 114 may be a dual-ported video random access memory. One port of the video memory 114, in one example, is coupled to a video amplifier 116, which is used to drive a monitor 117. The monitor 117 may be any type of monitor suitable for displaying graphic images, such as a cathode ray tube monitor (CRT), flat panel, or liquid crystal display (LCD) monitor or any other suitable data presentation device.

In some embodiments, the processor 113 is a SPARC® microprocessor from Oracle Corporation, although any other suitable microprocessor or microcomputer may be utilized. The processor 113 and its protocols in relation to voltage monitoring mechanisms employed by the processor are described in more detail below.

The computer system 100 also may include a communication interface 120 coupled to the bus 118. The communication interface 120 provides a two-way data communication coupling via a network link. For example, the communication interface 120 may be a local area network (LAN) card, or a cable modem, and/or wireless interface. In any such implementation, the communication interface 120 sends and receives electrical, electromagnetic or optical signals which carry digital data streams representing various types of information.

Code received by the computer system 100 may be executed by the processor 113 as it is received, and/or stored in the mass storage 112, or other non-volatile storage for later execution. In this manner, the computer system 100 may obtain program code in a variety of forms. Program code may be embodied in any form of computer program product such as a medium configured to store or transport computer readable code or data, or in which computer readable code or data may be embedded. Examples of computer program products include CD-ROM discs, ROM cards, floppy disks, magnetic tapes, computer hard drives, servers on a network, and solid state memory devices.

Figure 2:
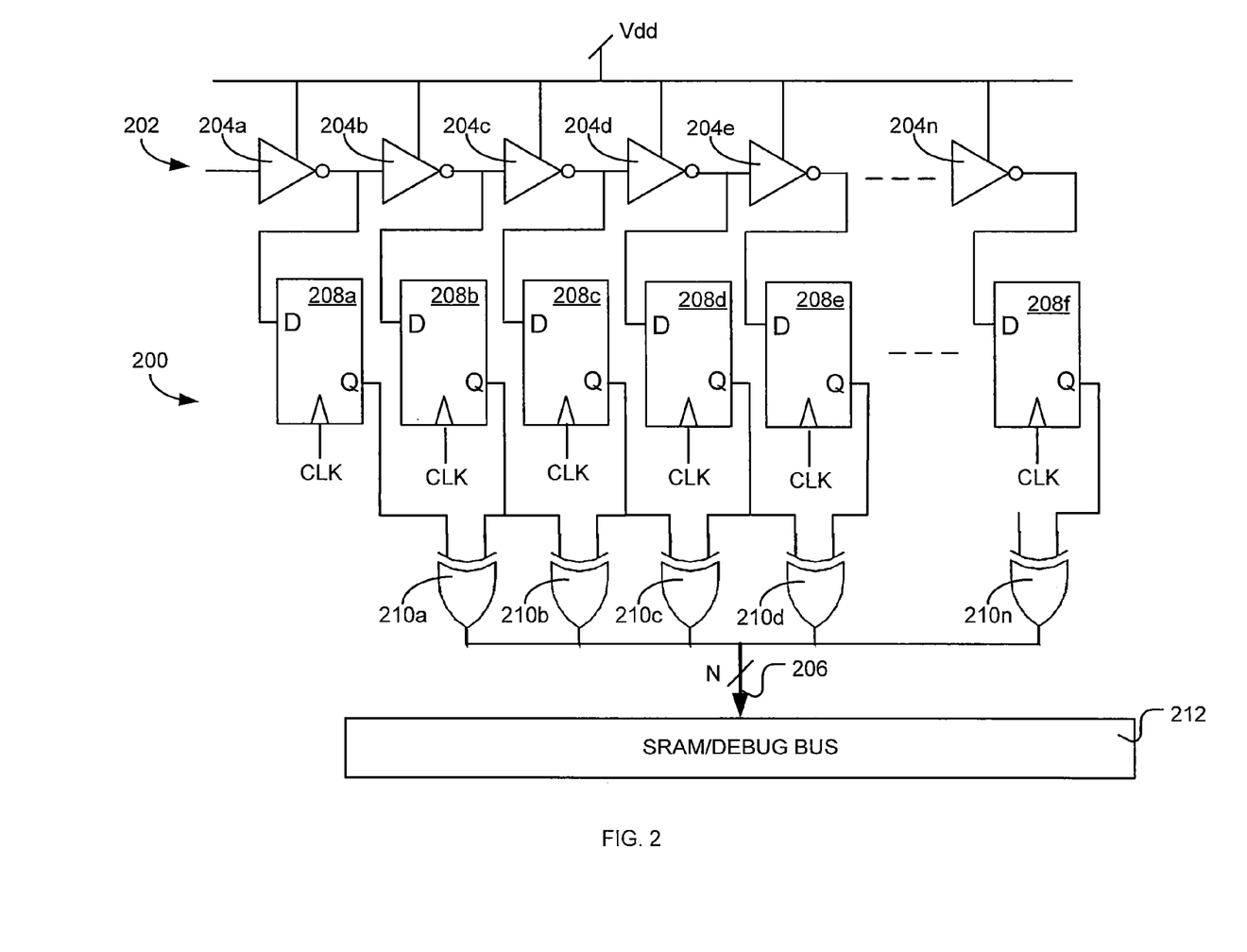
FIG. 2 is a schematic illustration of an embodiment of a digital voltage monitor circuit.

A digital voltage monitor and measurement circuit for an integrated circuit is shown in FIG. 2 and is generally identified by reference numeral 200. The voltage monitor 200 is operable to sample the power supply voltage of an integrated circuit during a cycle of the system clock. In general, the voltage monitor 200 produces an N-bit voltage measurement signal 206 that indicates a power supply voltage measurement. As used herein, an "N-bit" signal is a digital signal containing a certain number of bits. The number of bits included in the voltage measurement signal 206 will vary depending on the application. Generally, the greater the number of bits used in the voltage measurement signal 206, the more precise the power supply voltage measurement will be. However, the number of bits used in the voltage measurement signal 206 may be limited by power consumption and/or space availability constraints.

In the embodiment shown in FIG. 1, the voltage monitor 200 includes a delay chain 202 that includes single rail of interconnected inverters 204a-n. Like other components in the integrated circuit, each inverter 204a-n of the delay chain 202 is powered by the integrated circuit's power supply. The delay that a signal or wavefront experiences when propagating through each inverter 204a-n of the delay chain 202 may depend on fluctuations in the power supply voltage. Each inverter 204a-n may include a circuit element such as a pull-up and/or a pull-down transistor (not shown). These transistors have a switching time that is affected by variations in the power supply voltage. Thus, a higher power supply voltage will result in a faster switching time for the transistor and the corresponding inverter. Conversely, a lower power supply voltage will result in a slower switching time. Hence, the delay through an inverter 204a-n of the delay chain 202 will be less in a higher power supply voltage situation than the delay in a respectively lower power supply situation.

With this in mind, the delay chain 202 may be used to determine the power supply voltage of an integrated circuit by measuring the progress of a wavefront through the chain 202. Measuring the progress of the wavefront through a delay chain 202 may be accomplished by a number of flip-flops 208a-n. Each inverter 204a-n in the delay chain 202 includes an output that is connected to an input of a corresponding flip-flop 208a-n. The flip-flops 208a-n are each clocked by a signal that causes them to sample their inputs at a predetermined time. The digital voltage monitor circuit 200 may be calibrated so that the flip-flops 208a-n sample their inputs at a point in time in which the wavefront has partially propagated down the delay chain 202. More particularly, the wavefront may be initiated in the delay chain 202 at a first time instance and sampled by the flip-flops 208a-n at a second time instance. In sampling the delay chain 202, a power supply voltage measurement is stored by the flip-flops 208a-n. Each flip-flop 208a-n holds one bit and together the ordered sequence of bits provides in digital form this power supply voltage measurement.

In particular, the outputs of the flip-flops 208a-n provide a multiple-bit string that indicates how far through the delay chain 202 a waveform has traveled. Such a multiple-bit string is shown as bit string 602 in FIG. 6. In the example shown, a one or high bit value indicates that the waveform has passed through the inverter 204a-n associated with bit position and a zero or low bit value indicates that the waveform has not passed through the inverter 204a-n associated with bit position. Thus, the bit position in the string 602 in which the values of the bits transition from one to zero indicates the point in the delay chain 202 that the waveform was transmitted. As can be appreciated, this position may vary based on the voltage level of Vdd supplied to the inverters 204a-n of the delay chain 202. In another embodiment of the voltage monitor circuit, the values of the output string 602 may include a series of zero or low values followed by series of one or high values, with the crossover position indicating the position the wavefront was propagated. The analysis and processing of the output string 602 to calculate a relative voltage value for Vdd is described in more detail below.

Figure 3:
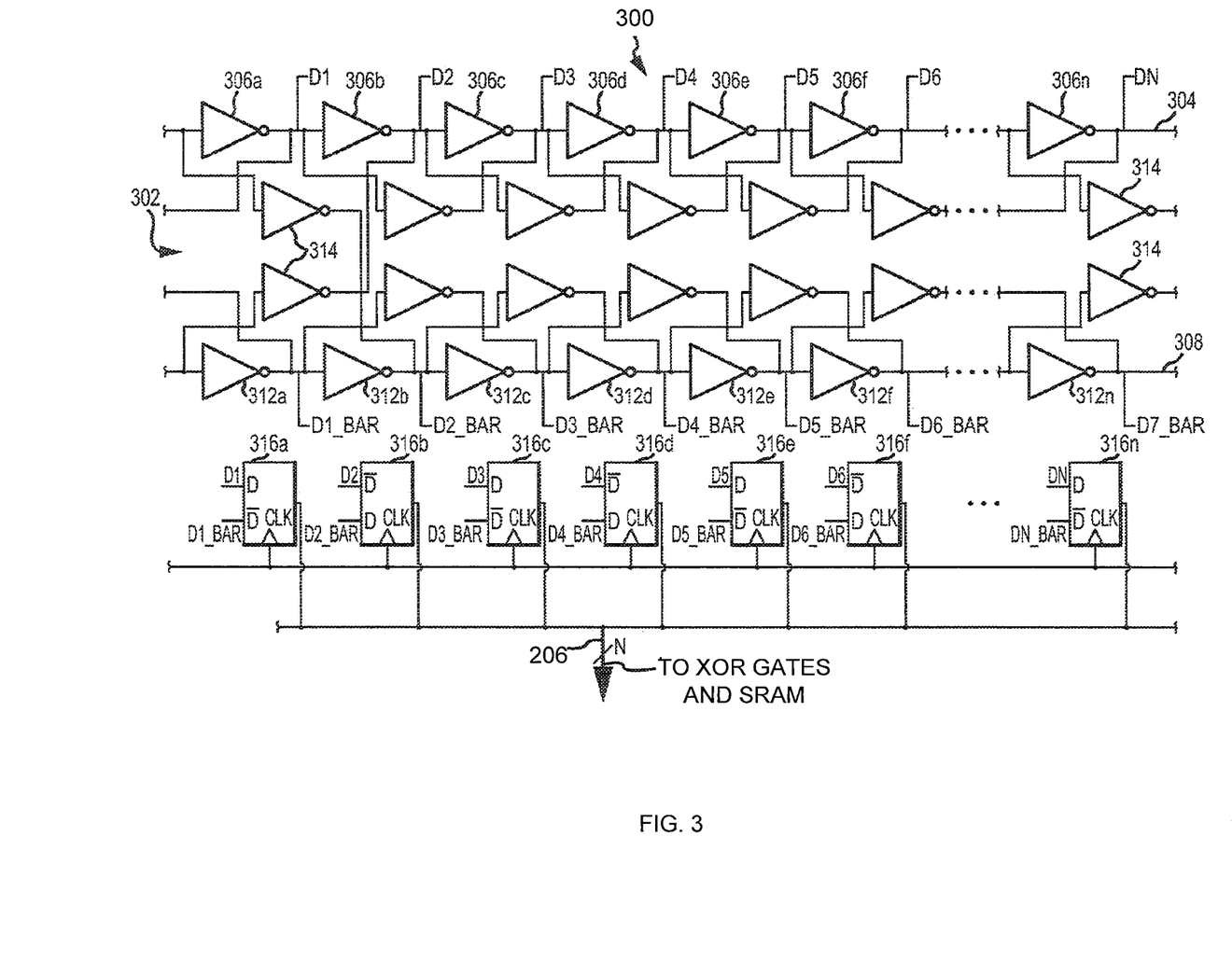
FIG. 3 is a schematic illustration of another embodiment of a digital voltage monitor circuit.

FIG. 3 is another embodiment of the voltage monitor 200 shown in FIG. 2. The voltage monitor 200 embodiment shown in FIG. 3 includes a delay chain 302 that includes two delay chains rails interconnected by means of cross-coupled inverters. The first delay chain rail 304 includes a series of interconnected rail inverters 306a-n. The second delay chain rail 308 includes a series of interconnect rail inverters 312a-n. The delay chain 302 additionally includes a number of cross-couple inverters 314 that interconnect the first delay chain rail 304 with the second delay chain rail 308. A particular cross-couple inverter 314 connects a rail inverter in the first delay chain rail 304 to a rail inverter in the second delay chain rail 308, or connects a rail inverter in the second delay chain rail 308 to a rail inverter in first delay chain rail 304. The cross-couple inverters 314 have a "feed-forward" characteristic. As used herein "feed-forward" refers to a circuit path or element that connects a first circuit node to a second circuit node, the second node being ahead of or "downstream" from the first node with respect to the flow of information in the circuit. With respect to the delay chains, a feed-forward element or path may advance information down the chain a certain number of stages and in so doing bypass intermediate stages.

In the delay chain 302 shown in FIG. 3, each cross-couple inverter 314 feeds forward two stages in the delay chain 302. A cross-couple inverter 314 feeds a signal from the initial input on the first delay chain rail 304 forward past the second rail inverter 306b to the input of the third rail inverter 306c of the second delay chain rail 308. Similarly, a cross-couple inverter 314 feeds a signal from the initial input on the second delay chain rail 308 forward past the second rail inverter 312b to the input of third rail inverter 312c of first delay chain rail 304. This feed-forward-two characteristic is repeated for subsequent stages of the delay chain 302.

Measuring the progress of the wavefront down the delay chain 302 may be accomplished by a number of dual input flip-flops 316a-n. Each dual input flip-flop 316a-n takes one input from the first delay chain rail 304 and another input from the second delay chain rail 308. In this way, each dual input flip-flop 316a-n receives a signal and a simultaneous complement of that signal. The dual input flip-flops 316a-n are each clocked by a signal that causes them to sample their inputs at a predetermined time. The digital voltage regulator 100 may be calibrated so that the dual input flip-flops 316a-n sample their inputs at a point in time in which a wavefront has partially propagated down the delay chain 302. More particularly, the wavefront may be initiated in the delay chain 302 at a first time instance and sampled by the dual input flip-flops 316a-n at a second time instance. In sampling the delay chain 302, a power supply voltage measurement is stored by the dual input flip-flops 316a-n. Each dual input flip-flop 316a-n holds one bit and together the ordered sequence of bits provides in digital form this power supply voltage measurement.

As described above, the power supply voltage measurement held by the dual input flip-flops 316a-n of FIG. 3 is a series of bits arranged from most significant bit to least significant bit. (It should be appreciated that this and the following discussion equally apply to the flip-flops 208a-n.) One example of the output is illustrated at bit string 602 of FIG. 6. Each bit corresponds to a stage in the delay chain 302, 202. The value of each bit represents whether or not the wavefront reached the corresponding stage in the delay chain 302, 202 when the delay chain 302, 202 was sampled. For purposes of illustration, say that a value of one indicates that the wavefront did reach the corresponding stage, and a value of zero indicates that the wavefront did not reach the corresponding stage. Accordingly, the power supply voltage measurement will be a series of ones at the most significant end and series of zeros at the least significant end. The most significant zero in the power supply voltage measurement will therefore correspond to the location of the wavefront in the delay chain 302, 202 when the delay chain was sampled. The closer the most significant zero is to the least significant end of the power supply voltage measurement, the further the wavefront traveled down the delay chain 302, 202. The greater the power supply voltage, the further down the delay chain 302, 202 the wavefront will travel, and vice-versa. Accordingly, the greater the most significant zero of the power supply measurement, the lesser is the power supply voltage.

Figure 4:
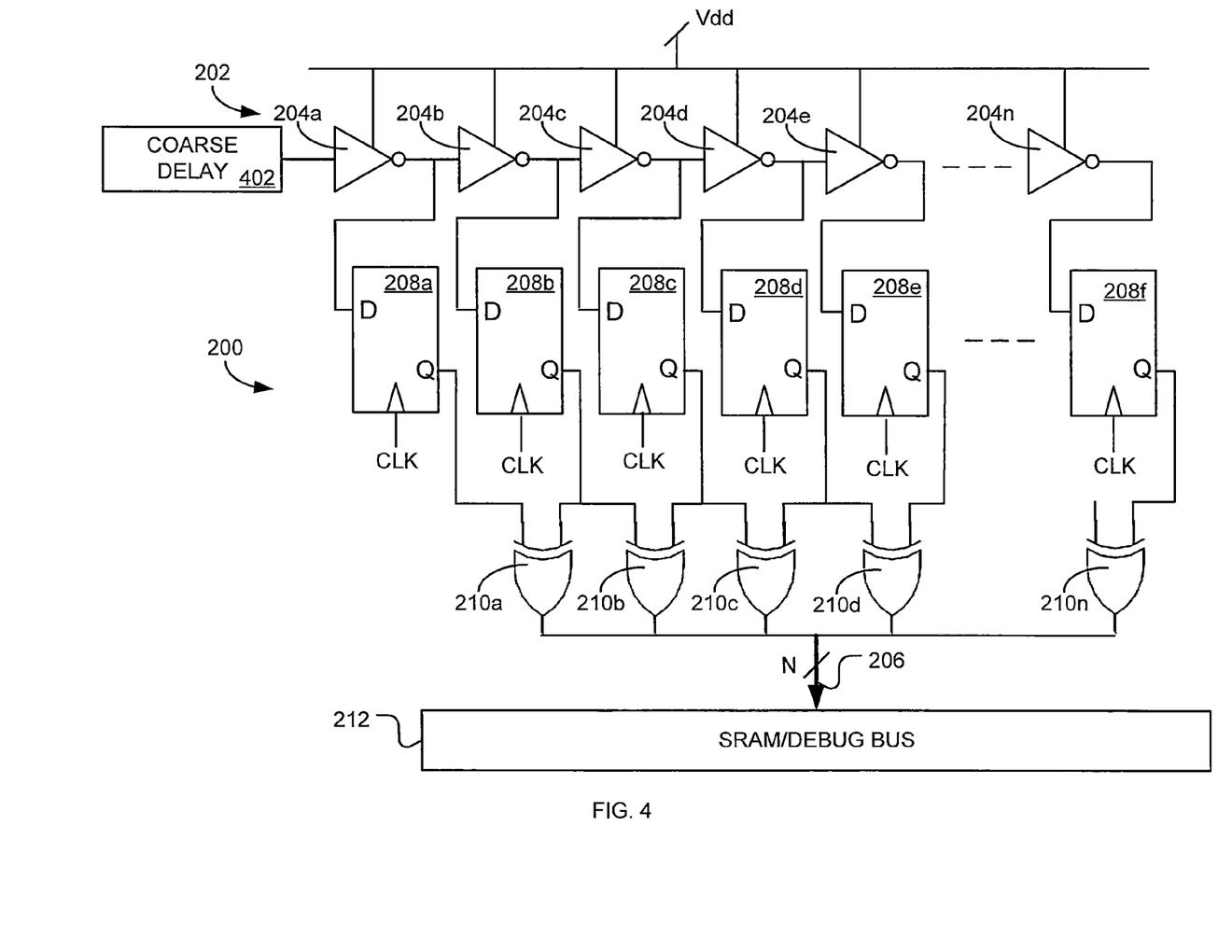
FIG. 4 is a schematic illustration of another embodiment of a digital voltage monitor circuit incorporating a coarse delay device or circuit.

FIG. 4 is a schematic illustration of another embodiment of a digital voltage monitor circuit incorporating a coarse delay device or circuit. The digital voltage monitor circuit 400 of FIG. 4 is similar to the monitor circuit of FIG. 2 such that the circuit includes a delay chain 202 including single rail of interconnected inverters 204a-n and a group of corresponding flip-flops 208a-n. The operation of the digital voltage monitor circuit 400 is also similar to the voltage monitor circuit described above. However, the voltage monitor 400 of FIG. 4 also include a coarse delay device or series of components 402 that is configured to provide a coarse delay to a waveform transmitted through the delay chain 202.

As shown, the coarse delay device 402 is electrically connected to the input of the delay chain 202 of the voltage monitor circuit 400. In general, the coarse delay device 402 is configured to delay a waveform transmitted through the coarse delay device. Further, the coarse delay device 402 may be configurable or programmable to adjust the length of the delay applied to any waveform transmitted through the device. When connected to the delay chain 202 of the voltage monitor circuit 400, the coarse delay device 402 allows for fine tuning of the dynamic range of the voltage monitor circuit. In operation, the coarse delay device 402 delays the input waveform to prevent the waveform from transmitting through the entire delay chain prior to being captured by the corresponding flip-flops 208a-n. This can ensure that the waveform is within the delay chain 202 when the latching mechanism of the flip-flops 208a-n is triggered. Further, by tuning the delay caused by the coarse delay device 402, the dynamic range of the output value provided by the circuit may become finer, allowing for a more accurate measurement of the voltage change of the circuit.

Returning to the voltage monitor circuit 200 of FIG. 2, the output of each of the flip-flops devices 208a-n is connected to a corresponding logic gate 210a-n. In one specific embodiment, the logic gates 210a-n may be a series of two-input XOR logic gates. The logic gates 210a-n are arranged such that the output of one flip-flop device connects to a first input to the logic gate and the output of the next flip-flop device connects to a second input to the logic gate. In this manner, each logic gate 210a-n compares a bit of the output signal from the circuit to the next bit in the output signal. In essence, the logic gates 210a-n operate to determine the location of the crossover in the bits stored in the flip-flops devices 208a-n from high to low to indicate the propagation of the waveform through the delay chain. The output of the logic gates 210a-n is combined as the digital voltage monitor circuit output 206.

Figure 6:
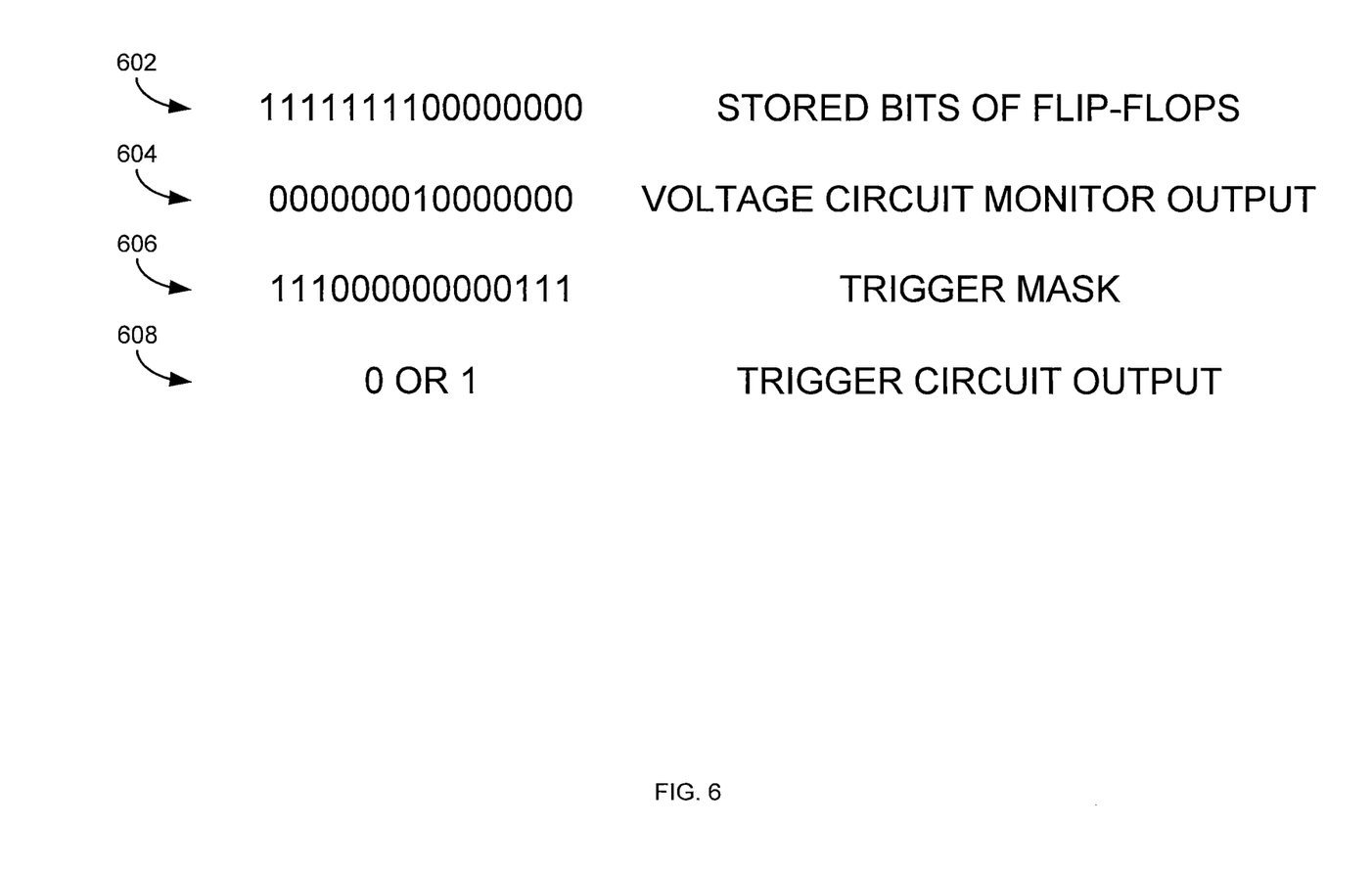
FIG. 6 is an illustration of digital signals associated with the digital voltage monitor circuit of FIG. 2.

FIG. 6 includes an example of the voltage monitor circuit output string 206. In particular, the output string 206 illustrated in FIG. 6 corresponds to the multi-bit string 602 of bits stored in the flip-flop devices of the voltage monitor circuit. As shown, the output string 206 indicates with a bit value one or high the location of the crossover between bit values one and bit value zero in the multi-bit string 602. This is accomplished through the logic gates of the circuit 200 that compares a bit of the multi-bit string 602 with the next bit in the string. Where the bits change from high to low or low to high, the output string 206 includes a one or high value. This high value thus corresponds to a relative voltage measurement for the voltage monitor circuit 200 and can be analyzed to determine a voltage level for the circuit under various loads and environments. For example, the closer the high value in the output string 206 is to the most significant end of the string, the slower the waveform propagates through the delay chain 202 due to a lower voltage Vdd being provided to the inverters 204a-n of the circuit 200. Conversely, the closer the high value in the output string 206 is to the least significant end of the string, the faster the waveform propagates through the delay chain 202 due to a higher voltage Vdd is being provided to the inverters 204a-n of the circuit 200. It should be appreciated that the output sting 206 may include a series of one or high values with a low or zero value indicating the propagation of the waveform through the delay chain 202.

With a generated output string 206, a circuit or device utilizing the voltage monitoring circuit 200 may analyze the operating voltage of the circuit or device for various reasons. For example, the information may be utilized to monitor the performance of the circuit through various loads and operating conditions. In addition, various operations may be performed on the output string 206 to aid in the analysis of the measurements. In one example, the output string 206 is transmitted to a watermarking module of the integrated circuit. The watermarking module is configured to determine the highest and/or lowest readings from the voltage monitoring circuit 200. In one example, the watermarking module includes an AND logic component that logically ANDs each of the received output strings 206 from the voltage monitoring circuit 200 together. The output of the logic component provides a bit string indicating the highest voltage and lowest voltage reading received by the watermarking module from the voltage monitoring circuit 200. In another example, the output string 206 is provided to a priority encoder module of the integrated circuit. The priority encoder module may be configured to address the situation where the output string 206 includes more than one asserted bit in the output. More than one asserted bit in the output string 206 may occur for many reasons, such as a mistakenly flipped bit due to electromagnetic radiation, and the like. In such as case, the priority encoder module is configured to ensure that only one bit in the output string 206 is set. For example, the priority encoder module may retain the lowest asserted bit and set the other asserted bits back to a zero or low value. However, the priority encoder may be configured to retain any of the asserted bits as desired.

Regardless of the implementations of the voltage monitor utilized by the integrated circuit, the output string 206 may be obtained and analyzed to determine the performance of the circuit. However, in some implementations, the measured output string 206 corresponding to the measured voltage of the circuit may be difficult to obtain from the circuit. For example, the output may be stored in a memory device and read out one bit at a time to a logic analyzer or other analyzing device. Thus, the voltage of the circuit may be measured by the voltage monitor circuit 200 at any instant, but reading out of the measured value on an output pin to a logic analyzer may require several clock cycles. However, in one embodiment, the voltage monitor circuit 200 may be configured to provide the voltage measurement in a manner that can be analyzed over a period of time to provide a graph of the voltage change over time.

Returning again to the circuit 200 of FIG. 2, the output signal 206 may be supplied to a static random access memory (SRAM) device and debug bus 212. In one embodiment, the output signal 206 is supplied to the SRAM device, which can then be read from the SRAM device to the debug bus 212. In another embodiment, the SRAM and the debug bus are separate components of the integrated circuit such that the output signal 206 can be stored in the SRAM or transmitted along the debug bus for retrieval by an external analyzer. Whether together or separate, the SRAM and the debug bus 212 provide a way for the output of the voltage monitor circuit 200 to be accessed by an analyzer of the circuit.

In one embodiment of the circuit 200, each output of the logic gates 210a-n may be provided to an SRAM storage component 212. By providing each output of the logic gates 210a-n to the SRAM 212, several consecutive measurements obtained by the circuit can be stored such that voltage measurements over a specific time frame are captured. For example, a circuit 200 utilizing N number of logic gates 210*a-n* may include N number of transmission lines to the SRAM, each transmission line corresponding to a bit of the output signal 206. In this manner, each bit of the output signal 206 is stored in the SRAM 212, rather than reading the value into the SRAM as a string. Thus, the entire output string 206 is read into the SRAM at once. By latching each bit of the output string 206 in the SRAM 212 at the same time, several measurements of the voltage can be taken by the circuit corresponding to consecutive clock cycles of the circuit. The number of consecutive clock cycles that the voltage monitor circuit 200 obtains and stores voltage measurements may be referred to as the time period for the measurements. Extracting and analyzing the stored output signals 206 provides a measurement of the voltage of the circuit over the time period. In this manner, the circuit 200 may be provided with different conditions or loads over the time period and the change in voltage measured by the circuit can be analyzed for those different conditions and loads. The feature of storing the measured voltages over a time frame provides a more robust analysis of the circuit than previous voltage monitoring circuits as voltage measurements can be obtained at a high rate, such as every 300 picoseconds.

Similarly, the output string 206 of the circuit 200 may be provided to a debug bus 212. As stated above, the debug bus 212 may be connected to the output of the SRAM such that reading out of the stored output places the output on the debug bus. In this manner, the SRAM 212 may operate as a buffer to the debug bus. In general, the debug bus 212 is a multiple transmission line bus that provides a connection point for an external analyzer to the integrated circuit to read out the measured voltage values. During operation of the voltage monitoring circuit 200, an external analyzer may connect to the debug bus (through one or more pins) and receive the measured voltages from the circuit. This information may be analyzed by the external analyzer to provide a graph or other analysis of the voltage measurements over the time period. By providing the output signal 206 to the debug bus 212, a longer time period of analysis may occur as there is no fear of a memory device within the integrated circuit filling up with the measurement values. Further, by analyzing the voltage over the time period, time-domain analysis of the performance of the integrated circuit may also occur.

In another embodiment, the voltage monitor circuit 200 includes a triggering mechanism that starts the storing of the measured values of the voltage upon occurrence of the triggering mechanism. In general, the triggering mechanism includes a triggering mask that is applied logically to the voltage monitor circuit output 206 to obtain a triggering signal. The triggering signal enables an SRAM device or other storage component to begin storing the calculated voltage values from the voltage monitor circuit 200. In one embodiment, the storing of the calculated values continues until the storage component is full, beginning at the triggering event.

Figure 5:
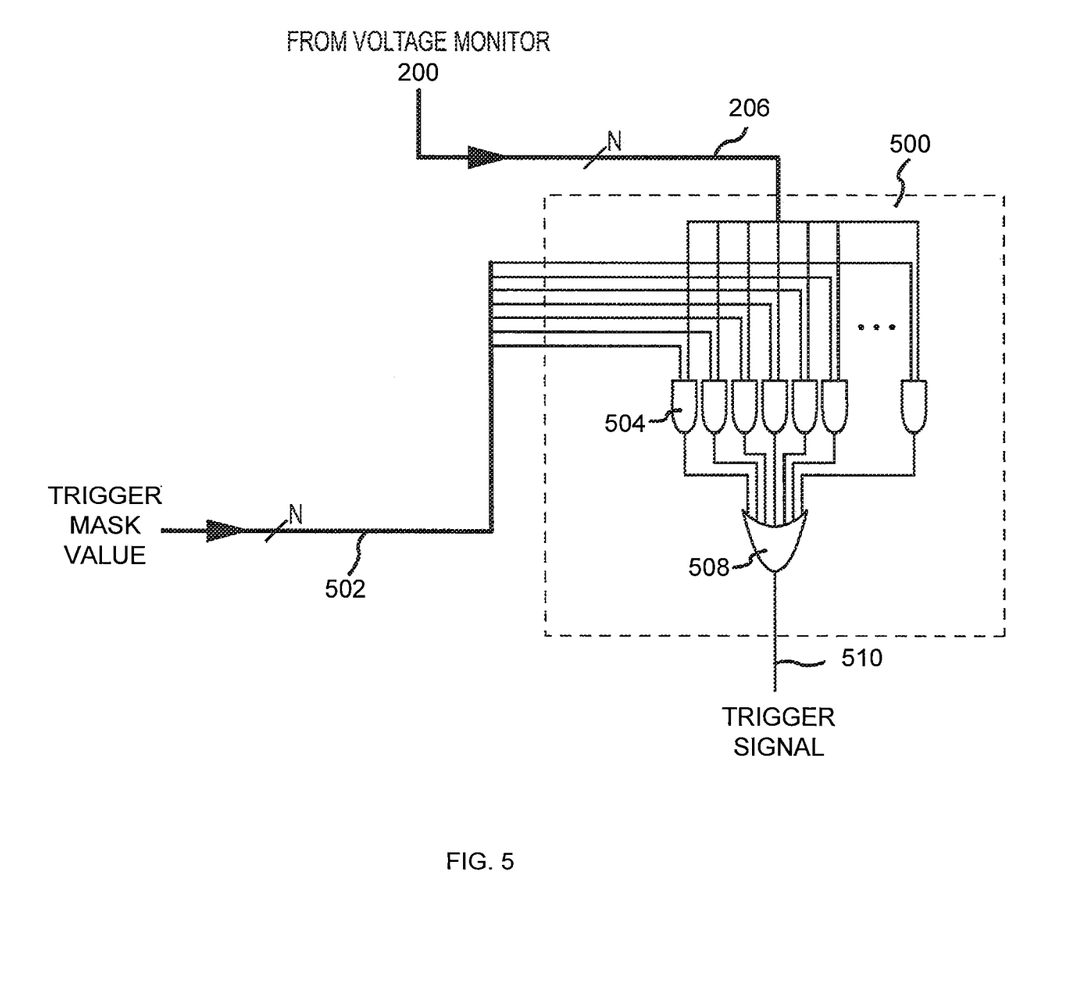
FIG. 5 is a schematic illustration of a triggering circuit for the digital voltage monitor circuit of FIG. 2.

FIG. 5 is a schematic illustration of a triggering circuit for the digital voltage monitor circuit of FIG. 2. As shown in FIG. 5, the N-bit voltage output signal 206 is provided from the voltage monitor 200 to the trigger circuit 500, where it is compared against an N-bit triggering mask signal 502. One example of an N-bit triggering mask signal 502 is shown in FIG. 6 as string 606. In general, the triggering mask signal 502, 606 defines one or more voltage levels that result in the triggering of the recording of the voltage circuit output values. In particular, when the voltage monitor circuit output value 206 corresponds to a value identified in the triggering mask, the triggering circuit 500 outputs an enable signal 510 that begins the storing of the voltage monitor output signals 206.

The functionality of comparing the voltage monitor output signal 206 with the triggering mask signal 502 to trigger the storing of the output signals may be implemented at the gate-level as shown in FIG. 5. FIG. 5 shows a triggering circuit 500 having a plurality of AND gates 504. Each AND gate 504 is configured to receive as input a bit from the voltage measurement output signal 206 and a corresponding bit from the trigger mask signal 502. Based on this input, each AND gate 504 is configured to output a logical AND of the two input signals. The comparator 500 additionally includes an OR gate 508 configured to receive the output from each of the AND gates 504 as a plurality of inputs and configured to output a logical OR of the plurality of inputs. The output from the OR gate 508 is output from the comparator 500 as the trigger enable signal 510.

Using the signals illustrated in FIG. 6 as examples, the operation of the triggering circuit 500 is described herein. In particular, the voltage circuit output 206, 604 is compared to the triggering mask signal 502, 606 by the AND gates 504 of the circuit 500. As each bit is compared, an instance of a one or high bit in the voltage circuit output signal 206, 604 in the same bit position as a one or high in the trigger mask signal 502, 606 results in a one output at the OR gate 508 and the output of the triggering circuit 500. In this manner, when a voltage monitor circuit output 206, 604 includes a one or high value that corresponds to a one or high in the same bit position in the triggering mask signal 502, 606, the output of the triggering circuit becomes a one or high. Thus, the triggering mask signal 502, 606 defines those voltage monitor circuit output 200 by the asserted or high bits within the triggering mask signal.

As also shown in FIGS. 5 and 6, the trigger circuit output 510, 608 is a single bit one or zero. In one embodiment, a high or one value of the trigger signal 510 acts as an enable signal to a storage device, such as an SRAM memory module. When the trigger signal 510 is asserted, the SRAM begins storing each output of the voltage monitor circuit 200 until full. In one example, the SRAM may store up to 512 voltage monitor circuit outputs. However, the SRAM may be configured to store any number of voltage monitor circuit outputs. In another embodiment, the SRAM may be configured to store every output in a first in, last out manner. Upon receiving the trigger signal, the SRAM may begin storing more voltage monitor circuit outputs corresponding to half of the capacity of the SRAM, such the SRAM stores voltage circuit outputs from before and after the triggering event.

In general, the triggering circuit 500 operates to begin storage of the voltage monitor circuit outputs 206 when the measured voltage is too high or too low, relative to the dynamic range of the voltage circuit output and as defined by the triggering mask 502. However, the trigger mask signal 502 may be configured to begin storage of the circuit output for any measured output voltage. Once stored, the stored output values may be read out of the SRAM device as described above, such as along the debug bus 212.

Another advantage realized through the voltage monitor circuit discussed herein is the operation and circuit and measurement of the voltage for different clock signals. In some integrated circuits, more than one clock generating circuits providing different clock signals may be utilized for operation of the integrated circuit. However, because the voltage monitor circuit 200 does not require a particular clock signal to operate, any clock signal may be provided to the circuit to operate the circuit. Thus, a voltage measurement may be taken for the various clock signals in the integrated circuit to provide the voltage reaction on the circuit for the various clock signals. Further, a plurality of voltage monitor circuits may be implemented within an integrated circuit design such that a comparison between the voltage changes for each clock signal may be made to determine the effect of voltage noise for each clock signal.

Figure 7:
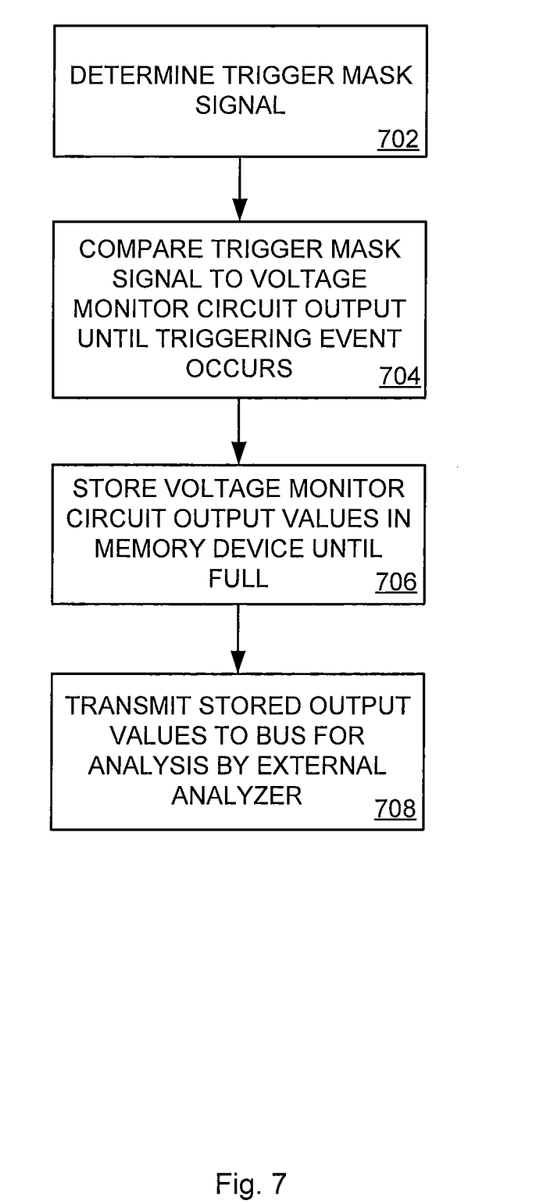
FIG. 7 is a flowchart of a method for utilizing a digital voltage monitor circuit to obtain voltage measurements for an integrated circuit.

FIG. 7 is a flowchart of a method for utilizing a digital voltage monitor circuit to obtain voltage measurements for an integrated circuit. In general, the operations of FIG. 7 are performed by an integrated circuit. More particularly, the operations are performed through one or more logic components of a circuit, one or more software programs executed by the integrated circuit, or a combination of both hardware and software components.

Beginning in operation 702, the integrated circuit determines the trigger mask signal or trigger mask value. As described above, the trigger mask signal may be programmable such that a user of the integrated circuit may program the trigger mask value to obtain the desired triggering mechanism of the circuit. In another embodiment, the integrated circuit may determine the trigger mask signal based on any performance criteria of the circuit, such as a typical operating voltage of the circuit. Regardless of how the trigger mask signal is determined, the integrated circuit may store the trigger mask signal in a memory component of the circuit for use in determining when a triggering event occurs.

In operation 704, the circuit compares an obtained voltage monitor circuit output to the trigger mask to determine if a triggering event occurs. One embodiment of the circuit utilizes the comparator illustrated in FIG. 5 to compare the obtained output and the triggering mask signal. In addition, the circuit may continue to compare the obtained outputs of the voltage monitor circuit to the triggering mask signal until a triggering event occurs, such as a high voltage reading or a low voltage reading.

In operation 706, the circuit begins storing the obtained outputs from the voltage monitor circuit in a memory device, such as an SRAM component of the circuit. This storing occurs upon the occurrence of the triggering event. Further, the circuit may continue to store the obtained outputs in the memory device until the memory device is full, or until a limit of the number of stored outputs is reached. In operation 708, the stored outputs are then transmitted to a bus for retrieval by an external analyzer to the circuit. In this manner, the circuit may monitor the voltage of the circuit and provide the measurements to an analyzer to obtain the voltage fluctuations over a period of time.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A method for measuring a voltage level in an integrated circuit, the method comprising:
  tuning a voltage monitor circuit by programming a coarse delay device in electrical communication with the voltage monitor circuit, the coarse delay device configured to delay a transmission of a waveform through the voltage monitor circuit based on a programmed value received at the coarse delay device;
  receiving a first N-bit output value corresponding to a first power supply voltage measurement from the voltage monitor circuit, the first N-bit output value comprising a plurality of un-asserted bits and one asserted bit where a bit position of the one asserted bit of the first N-bit output value indicates a relative voltage measurement of the voltage monitor circuit;
  receiving an N-bit trigger value corresponding to a pre-determined voltage measurement threshold value, the N-bit trigger value comprising a first plurality of asserted bit positions defining an upper voltage level and a second plurality of asserted bit position defining a lower voltage level;
  comparing the N-bit trigger value to the first N-bit output value, the comparison configured to detect whether the bit position of the one asserted bit of the first N-bit output value corresponds to one of the first plurality of asserted bit positions defining the upper voltage level or the second plurality of asserted bit position defining the lower voltage level;
  generating a trigger signal wherein the bit position of the one asserted bit of the first N-bit output value corresponds to one of the first plurality of asserted bit positions defining the upper voltage level or the second plurality of asserted bit position defining the lower voltage level;
  transmitting the trigger signal to a memory device comprising a plurality of storage locations, the trigger signal activating the memory device to begin storing a plurality of N-bit output values; and
  storing each of the plurality of N-bit output values in the plurality of storage locations of the memory device corresponding to a plurality of power supply voltage measurements measured over a period of time and occurring after receiving the first N-bit output value in the memory device until the plurality of storage locations of the memory device are full.

2. The method of claim 1 further comprising:
  outputting the plurality of N-bit output values corresponding to a plurality of power supply voltage measurements in the memory device for the period of time to an external analyzer to obtain the plurality of power supply voltage measurements over the period of time.

3. The method of claim 1 wherein the comparing operation comprises:
  comparing each bit of the N-bit output value to a corresponding bit of the N-bit trigger value through a plurality of logical AND gates; and
  calculating a logical OR of the comparison of each bit of the N-bit output value to a corresponding bit of the N-bit trigger value, wherein a logical high value of the calculation indicates when the first N-bit output value corresponding to the power supply voltage measurement is less than the pre-determined voltage measurement threshold value.

4. The method of claim 1 wherein the receiving operation comprises:

obtaining the N-bit trigger value corresponding to a pre-determined voltage measurement threshold value from an integrated circuit, wherein the N-bit trigger value is programmable and maintained by the integrated circuit.

5. The method of claim 1 further comprising:
transmitting the plurality of N-bit output values corresponding to a plurality of power supply voltage measurements to an N-bit debug bus.

6. The method of claim 1 wherein the first N-bit output value corresponding to a first power supply voltage measurement is produced by:
propagating a wave-front through a plurality of stages of a delay chain during a clock cycle at a rate that is dependent on the first power supply voltage; and
sampling the delay chain on a clock edge with a plurality of flip-flops each connected to a corresponding stage in the delay chain; and
transmitting the sampled delay chain values to a plurality of logical XOR gates, wherein the outputs of the plurality of logical XOR gates comprises the first N-bit output value corresponding to a first power supply voltage measurement.

7. The method of claim 6 the delay chain comprises a single rail of interconnected inverters and a coarse delay device configured to further delay the propagation of the wave-front through the delay chain.

8. The method of claim 1 wherein the storing operation comprises:
receiving plurality of N-bit output values corresponding to a plurality of power supply voltage measurements on an N number of input to the memory device such that the plurality of N-bit output values are stored on subsequent clock cycles of the integrated circuit.

* * * * *

UNITED STATES PATENT AND TRADEMARK OFFICE
CERTIFICATE OF CORRECTION

| | |
|---|---|
| PATENT NO. | : 9,599,645 B2 |
| APPLICATION NO. | : 13/903445 |
| DATED | : March 21, 2017 |
| INVENTOR(S) | : Turullols |

Page 1 of 1

It is certified that error appears in the above-identified patent and that said Letters Patent is hereby corrected as shown below:

In Column 14, Line 6, in Claim 7, after "claim 6" insert -- wherein --.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*